(12) United States Patent  
Wu

(10) Patent No.: US 9,321,632 B2
(45) Date of Patent: Apr. 26, 2016

(54) SOCKET TYPE MEMS BONDING

(71) Applicant: Taiwan Semiconductor Manufacturing Company Ltd., Hsin-Chu (TW)

(72) Inventor: Ting-Hau Wu, Yilan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 17 days.

(21) Appl. No.: 14/204,472

(22) Filed: Mar. 11, 2014

(65) Prior Publication Data

US 2014/0193949 A1 Jul. 10, 2014

Related U.S. Application Data

(62) Division of application No. 12/537,047, filed on Aug. 6, 2009, now Pat. No. 8,710,638.

(60) Provisional application No. 61/225,731, filed on Jul. 15, 2009.

(51) Int. Cl.
*H01L 21/52* (2006.01)
*H01L 23/02* (2006.01)
*H01L 29/00* (2006.01)
*B81C 1/00* (2006.01)

(52) U.S. Cl.
CPC ....... *B81C 1/00269* (2013.01); *B81C 2201/019* (2013.01); *B81C 2203/0109* (2013.01); *H01L 2924/0002* (2013.01)

(58) Field of Classification Search
USPC ........................... 257/414, 619, 678; 438/106
See application file for complete search history.

(56) References Cited

U.S. PATENT DOCUMENTS

| 7,346,178 | B2 | 3/2008 | Zhe et al. |
| 2005/0170656 | A1 | 8/2005 | Nasiri et al. |
| 2006/0093170 | A1 | 5/2006 | Zhe et al. |
| 2008/0081423 | A1 | 4/2008 | Sadwick et al. |
| 2009/0096088 | A1* | 4/2009 | Aimi et al. ..................... 257/723 |

FOREIGN PATENT DOCUMENTS

EP 0434775 7/1991

* cited by examiner

*Primary Examiner* — Lynne Gurley
*Assistant Examiner* — Vernon P Webb
(74) *Attorney, Agent, or Firm* — Haynes and Boone, LLP

(57) ABSTRACT

A method for fabricating an integrated circuit device is disclosed. The method includes providing a first substrate; bonding a second substrate to the first substrate, the second substrate including a microelectromechanical system (MEMS) device; and bonding a third substrate to the first substrate.

20 Claims, 3 Drawing Sheets

SOCKET TYPE MEMS BONDING

PRIORITY DATA

This application claims priority to Provisional Application Ser. No. 61/225,731 filed Jul. 15, 2009, entitled "SOCKET TYPE MEMS BONDING," the entire disclosure of which is incorporated herein by reference. This application is a Divisional of U.S. patent application Ser. No. 12/537,047, filed Aug. 6, 2009, entitled "SOCKET TYPE MEMS BONDING," the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component that can be created using a fabrication process) has decreased. Such advances have increased the complexity of processing and manufacturing ICs and, for these advances to be realized, similar developments in IC processing and manufacturing are needed.

Microelectromechanical systems (MEMS) devices are very small electro-mechanical systems incorporated into ICs. These MEMS devices commonly have a top-cap (or capping structure) secured to the MEMS device to enclose, secure, and/or protect the MEMS device. Traditional bonding processes secure the capping structure directly to the MEMS device. These processes may decrease MEMS device reliability, which may result from mechanical damage to the MEMS device during the direct bonding process. Further, multiple patterning processes may be required, which results in higher than desirable manufacturing costs and time. Therefore, what is needed is an improved method and IC that protects and secures the MEMS device while reducing processing time and costs.

SUMMARY

The present disclosure provides for many different embodiments. In one embodiment, the present disclosure describes a method for fabricating an integrated circuit device. The method includes providing a first substrate; bonding a second substrate including a MEMS device to the first substrate; and bonding a third substrate to the first substrate.

A device fabricated by the method may include a substrate; one or more MEMS structures bonded to the substrate; and a capping structure over the one or more MEMS structures, wherein the capping structure is bonded to the substrate and encloses the one or more MEMS structures between the capping structure and the substrate.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
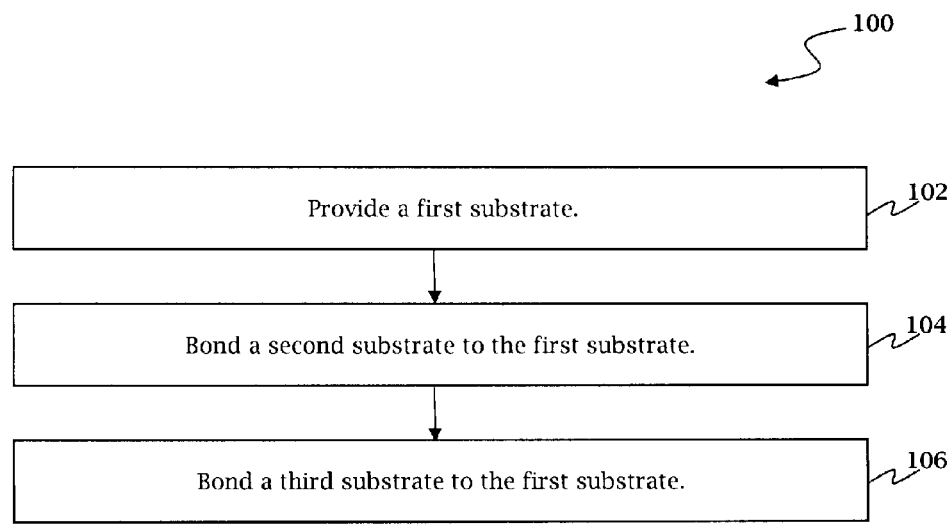
FIG. 1 is a flow chart of a method for fabricating an integrated circuit device according to aspects of the present disclosure.

The present disclosure relates generally to integrated circuit devices and a method for manufacturing such devices. It is understood that the following disclosure provides many different embodiments, or examples, for implementing different features of the invention. Specific examples of components and arrangements are described below to simplify the present disclosure. These are, of course, merely examples and are not intended to be limiting. For example, descriptions of a first feature "on" or "over" a second feature (and like descriptions) may include embodiments where the first and second features are in direct contact, and may also include embodiments where additional features are interposed between the first and second features. In addition, the present disclosure may repeat reference numerals and/or letters in the various examples. This repetition is for the purpose of simplicity and clarity and does not in itself dictate a relationship between the various embodiments and/or configurations discussed.

The present disclosure refers to microelectromechanical systems (MEMS) devices; however, one of ordinary skill in the art will find other applicable technologies that may benefit from the disclosure, such as nanoelectromechanical systems (NEMS) devices. FIG. 1 provides a flow chart illustrating a method 100 for fabricating an integrated circuit (IC) device including a MEMS device. FIG. 2 and FIGS. 3A-3C are cross-sectional views of IC devices 200 and 300 including a MEMS device fabricated by the method 100. The method 100 provides for socket-type MEMS bonding process. It is understood that additional steps can be provided before, during, and after the method 100, and some of the steps described below can be replaced or eliminated for additional embodiments of the method. It is further understood that additional features can be added in the IC devices 200, 300, and some of the features described below can be replaced or eliminated for additional embodiments of the IC devices 200, 300. The method 100 and the corresponding IC devices 200, 300 are exemplary only and not intended to be limiting. For example, the structure of the IC devices depicted in FIGS. 2 and 3A-3C are exemplary only and similar methods may be used to form any similar device.

Figure 2:
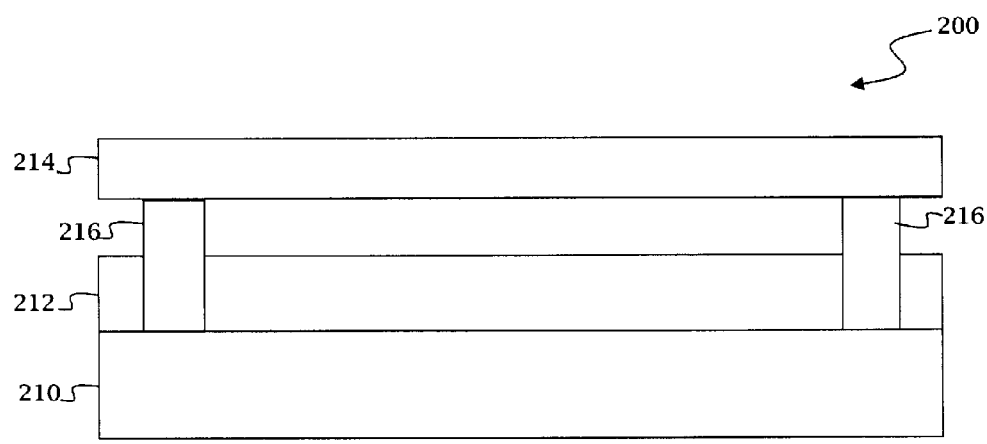
FIG. 2 is a cross-sectional view of an embodiment of a device fabricated according to the method of FIG. 1.

Referring to the method 100, at block 102, a first substrate is provided, for example, a first substrate 210 as illustrated in FIG. 2. The first substrate 210 may be a semiconductor substrate that includes an elementary semiconductor including silicon and/or germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the substrate may be a semiconductor on insulator (SOI. In some examples, the substrate may include a doped epi layer. In other examples, the silicon substrate may include a multilayer compound semiconductor structure. Alternatively, the first substrate 210 may include a non-semiconductor material, such as a glass, fused quartz, or calcium fluoride. In the present example, the first substrate 210 comprises silicon.

The first substrate 210 may be an integrated circuit, or portion thereof, that may comprise memory cells and/or logic circuits. The first substrate 210 may include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors; other suitable components; and/or combinations thereof. In an example, the first substrate 210 includes one or more CMOS devices, such as transistors (e.g., NMOS and/or PMOS transistors). The first substrate 210 may include circuitry associated with the transistors such as interconnect layers (e.g., metal lines and vias) and interlayer dielectric layers (ILD). The first substrate 210 may also include isolation structures and/or any other elements associated with integrated circuitry.

At block 104, a second substrate is bonded to the first substrate. For example, a second substrate 212 is bonded to the first substrate 210 as illustrated in FIG. 2. The second substrate 212 may be similar to the first substrate 210. The second substrate 212 may also comprise materials and circuitry as described above. The second substrate 212 includes a MEMS device in whole or in part. It is understood that the MEMS device may be constructed before of after the second substrate 212 is bonded to the first substrate 210. The MEMS device may include a plurality of elements formed of metal, polysilicon, dielectric, and/or other materials known in the art. The MEMS device may include materials typically used in a conventional CMOS fabrication process. Any configuration of a MEMS device is possible, depending on the desired functionality. One or more of the elements depicted may be designed to provide MEMS mechanical structures. The MEMS mechanical structures may include structures or elements operable for mechanical movement. The MEMS device may be formed using typical processes used in CMOS fabrication, for example, photolithography, etching processes (e.g., wet etch, dry etch, plasma etch), deposition processes, plating processes, and/or other suitable processes. In an embodiment, the MEMS device may be a motion sensor (e.g., a gyroscope, an accelerometer, etc.), a radio frequency (RF) MEMS device (e.g., an RF switch, filter, etc.), an oscillator, a MEMS microphone, or any other MEMS type device.

Typically, a third substrate (or capping structure) is bonded to the second substrate 212 including the MEMS device (which may be alternatively referred to as a MEMS structure). Directly bonding the third substrate to the MEMS structure (or second substrate) may decrease reliability of the MEMS device. This may be caused by mechanical damage to the MEMS device arising during the bonding process. Thus, in the method 100, at block 106, a third substrate 214 (also referred to as a capping structure) is bonded to the first substrate 210. The third substrate 214 may be similar to the first substrate 210, and in the present example, comprises silicon. As illustrated in FIG. 2, an exemplary bonding process involves forming a stand-off structure 216 on the third substrate 214 that extends through the second substrate 212 to contact the first substrate 210. The bonded first and third substrates 210, 214 protect (or encase) the second substrate/MEMS structure 212, forming a high hermetical chamber. Since the bonding may be controlled between the first and third (capping structure) substrates 210, 214, the method 100 may reduce or eliminate the impact of any direct mechanical damage to the second substrate/MEMS structure 212.

The bonding processes for bonding the first substrate 210 to the second and third substrates 212, 214 may be any suitable bonding process, such as a fusion bonding or a eutectic bonding process. The fusion bonding process may involve bringing the substrates into intimate contact, which causes the substrates to hold together due to atomic attraction forces (i.e., Van der Waal forces). The substrates may be subjected to an annealing process, after which a solid bond may be formed between the substrates. A temperature for the annealing process may be any suitable temperature, such as between about 200° C. and about 350° C. The fusion bonding process may arise from $SiO_2$(oxide)/Si bonding, Si/Si bonding, and/or other suitable bonding. The oxide can include high density plasma (HDP) oxide, tetraethylorthosilicate (TEOS) oxide, or plasma enhanced TEOS (PETEOS) oxide. The eutectic bonding process can be applied between any alloy suitable for the bonding temperature boundary condition. For example, the eutectic bonding process may include metal/metal bonding and/or metal/semiconductor bonding, such as Ge/Al bonding, Ge/Au bonding, Si/Au bonding, Si/Al bonding, and/or other suitable bonding. If the bonding process involves a substrate including CMOS devices, one may control the bonding temperature near or lower than CMOS device temperature limitations. The eutectic bonding processes may occur at high pressure and at any suitable temperature, such as between about 400° C. and 450° C.

Figure 3A:
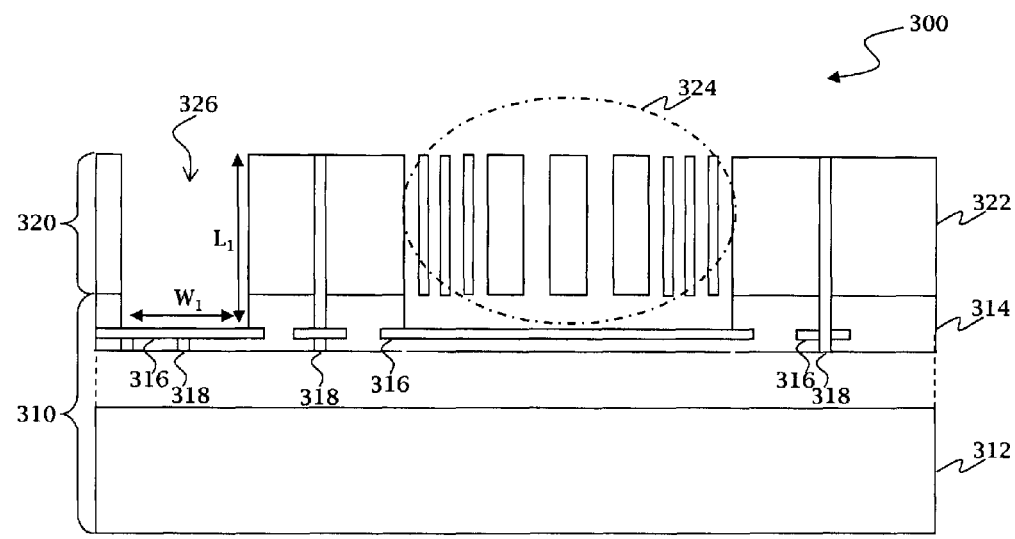
FIGS. 3A-3D are various cross-sectional views of an embodiment of a device during various fabrication stages according to the method of FIG. 1.
Figure 3B:
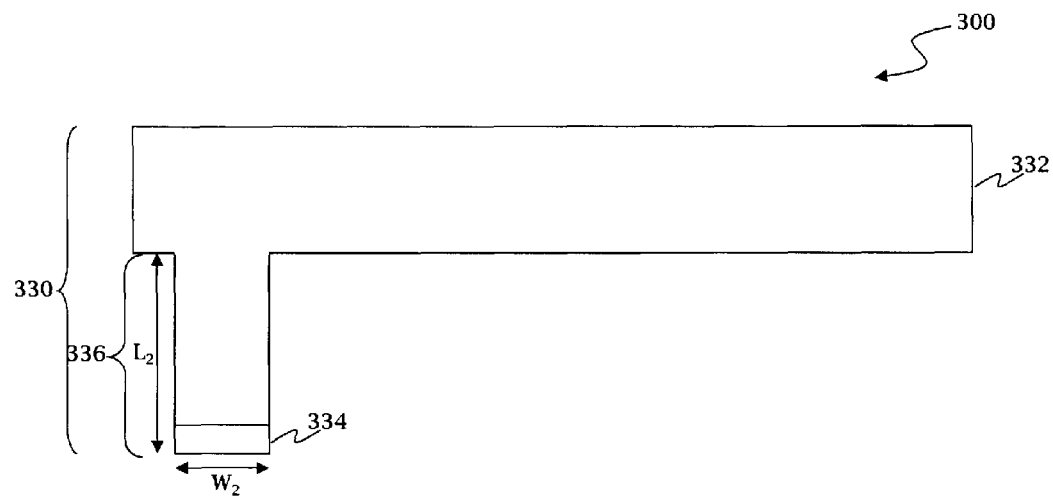
Figure 3C:
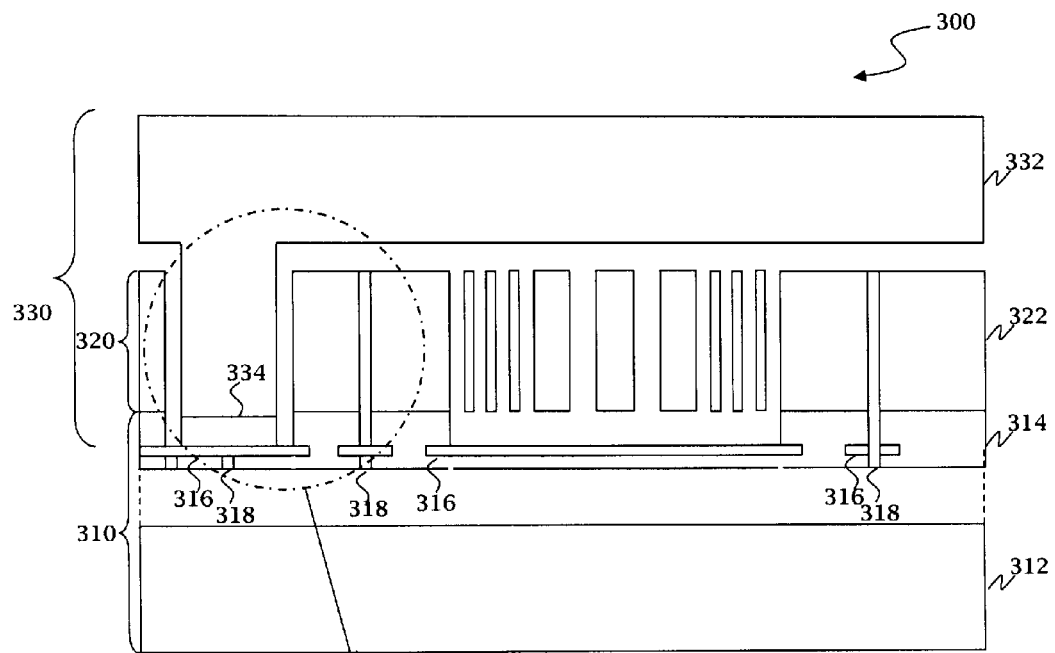

FIGS. 3A-3C are various cross-sectional views of a device 300 according to an embodiment of the present disclosure. FIG. 3A illustrates a first substrate 310 and a second substrate 320 bonded together; FIG. 3B illustrates a third substrate 330; and FIG. 3C illustrates the first substrate 310 bonded to the second and third substrates 320, 330. The device 300 may be fabricated by the method 100 described with reference to FIG. 1. Thus, the first substrate 310 may be provided, the second substrate 320 may be bonded to the first substrate 310, and the third substrate 330 may be bonded to the first substrate 310.

The first, second, and third substrates 310, 320, 330 may be similar to first, second, and third substrates 210, 212, 214 described above with reference to FIG. 2. It is understood that the first, second, and third substrates 310, 320, 330 may comprise the same or different materials and may comprise any suitable combination of materials. For example, the first, second, and third substrates 310, 320, 330 may be a semiconductor substrate that includes an elementary semiconductor including silicon and/or germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the substrate may be a semiconductor on insulator (SOI). In some examples, the substrate may include a doped epi layer. In other examples, the silicon substrate may include a multilayer compound semiconductor structure. Alternatively, the substrates may include a non-semiconductor material, such as a glass, fused quartz, or calcium fluoride.

Referring to FIG. 3A, the first substrate 310 includes one or more material layers and/or elements comprising any suitable material. The one or more material layers can include one or more high-k dielectric layers, gate layers, hard mask layers, interfacial layers, capping layers, diffusion/barrier layers, dielectric layers, conductive layers, other suitable layers, and/or combinations thereof. For example, the first substrate 310 includes material layers 312, 314, 316, 318. The material layer 312 may comprise a silicon layer; the material layer 314 may comprise an oxide layer, such as a HDP oxide or TEOS oxide; and material layers 316, 318 may comprise a conductive material, such as aluminum, copper, tungsten, titanium, tantulum, titanium nitride, tantalum nitride, nickel silicide, cobalt silicide, TaC, TaSiN, TaCN, other suitable conductive material, and/or combinations thereof. The material layers 316, 318 may provide one or more metal layers, forming vias, plugs, and various interconnects. For illustrative purposes, only a top conductive material layer 316 is illustrated. It is understood that numerous material layers may be provided between top conductive material layer 316 and material layer 312. The conductive material layer 318 may form various plugs, which can extend, in whole or in part, through various portions of the first second, and third substrates 310, 320, 330. It is further understood that the material layers are formed by any suitable process to any suitable thickness.

The second substrate 320 also includes one or more material layers and/or elements comprising any suitable material. The one or more material layers can include one or more high-k dielectric layers, gate layers, hard mask layers, interfacial layers, capping layers, diffusion/barrier layers, dielectric layers, conductive layers, other suitable layers, and/or combinations thereof. For example, the second substrate 320 includes a material layer 322. The material layer 322 may comprise silicon. The second substrate 320 also includes portions of material layer 318. The material layers are formed by any suitable process to any suitable thickness. The second substrate 320 may have a thickness between about 10 µm and about 40 µm, such as a thickness of 30 µm.

The first and second substrates 310, 320 are bonded together by any suitable method, such as the fusion or eutectic bonding processes described above. In the present example, since the second substrate 320 comprises a silicon material layer 322 and the first substrate 310 comprises an oxide material layer 314, when the material layers 322, 314 are brought into close contact, fusion bonding may occur. The first and second substrates 310, 320 may be subjected to an annealing process(es) to further solidify the oxide/Si bonding. Before or after the substrates 310, 320 are bonded together, one or more patterning processes are performed to form a MEMS device 324. The MEMS device 324 may include a plurality of elements formed of metal, polysilicon, dielectric, and/or other materials known in the art. The MEMS device may include materials typically used in a conventional CMOS fabrication process. Any configuration of a MEMS device is possible, depending on the desired functionality. One or more of the elements depicted may be designed to provide MEMS mechanical structures. The MEMS mechanical structures may include structures or elements operable for mechanical movement. The MEMS device 324 may be formed using typical processes used in CMOS fabrication, for example, photolithography, etching processes (e.g., wet etch, dry etch, plasma etch), deposition processes, plating processes, and/or other suitable processes, which may utilize one or more masking and patterning steps. In an embodiment, the MEMS device may be a motion sensor (e.g., a gyroscope, an accelerometer, etc.), a radio frequency (RF) MEMS device (e.g., an RF switch, filter, etc.), an oscillator, a MEMS microphone, or any other MEMS type device.

As noted above, conventional processing would bond the third substrate 330 to the second substrate 320 including the MEMS device. For example, a socket (cavity)/stand-off structure may be formed to bond the second and third substrates. This may involve forming a stand-off structure portion on the second substrate, forming a cavity in the third substrate, and extending the stand-off portion of the second substrate into the cavity of the third substrate until the stand-off portion and cavity portion contact to form a bond. When the stand-off portion and the cavity portion contact, the stand-off and cavity design contains squeezed material (e.g., alloy material) resulting from a high force bonding process. Such conventional processing may cause mechanical damage to the MEMS devices of the second substrate. Further, forming the stand-off structure portion and cavity portion requires multiple patterning processes, such as a mask to form the stand-off portion contact, a separate mask to form the cavity portion, and a separate mask to form a material layer to contact the stand-off portion contact. This results in increased manufacturing costs and time.

The present disclosure introduces bonding the third substrate directly to the first substrate to form a high hermetical chamber, which may contain (or protect) the second substrate having the MEMS device (i.e., MEMS structure) without impacting the MEMS device. Directly bonding the third substrate to the first substrate may result in increased MEMS device reliability. Also, manufacturing costs and time may be reduced because fewer masks and patterning processes are required for the third/first substrate bonding process. It is understood that different embodiments may have different advantages, and that no particular advantage is necessarily required of any embodiment.

A socket (cavity)/stand-off structure may also be used to form the first/third substrate bond. In the present example, the first substrate 310 is bonded to the third substrate 330 by forming a stand-off structure on the third substrate and a socket in the first and/or second substrates 310, 320. More particularly, a socket 326 (also referred to as an opening, trench, or cavity) is formed through the second substrate 320 until a portion of the first substrate 310 is exposed. The socket 326 comprises any suitable dimension, such as a length ($L_1$) and width ($W_1$), and provides a through-structure for the stand-off structure of the third substrate 330 to bond to the first substrate 310 as will be further discussed below. The socket 326 may have a dimension substantially similar to the stand-off structure. The socket 326 may be formed simultaneously or independently of the patterning process used to form the MEMS device. It may be advantageous to form the socket 326 simultaneously during the MEMS device patterning processes (i.e., using the same mask).

Referring to FIG. 3B, the stand-off structure is formed on the third substrate 330. The third substrate 330 includes one or more material layers similar to those described above. For example, the third substrate 330 includes material layers 332, 334 comprising any suitable material. The material layer 332 may comprise silicon, and the material layer 334 may comprise germanium. It is understood that the material layers are formed by any suitable process to any suitable thickness. A stand-off structure 336 includes a portion of the material layers 332, 334. The stand-off structure 336 may be formed using typical processes used in CMOS fabrication, for example, photolithography, etching processes (e.g., wet etch, dry etch, plasma etch), deposition processes, plating processes, and/or other suitable processes. Using only a single mask for forming the stand-off structure 336 on the third substrate 330 may advantageously result in decreased manufacturing costs and time.

The stand-off structure 336 comprises any suitable dimension, such as a length ($L_2$) and width ($W_2$), and may be substantially similar in dimension to the socket 326. The stand-off structure 336 and socket 326 have dimensions so that the stand-off structure 336 may fit into the cavity/socket 326 to bond the first and third substrates 310, 330 (i.e., $L_1 < L_2$ and $W_1 > W_2$). Exemplary dimensions may include a stand-off structure 336 with a length $L_2$ of approximately 50 μm and a width $W_2$ of approximately 50 μm, and the socket 326 with a length $L_1$ less than 50 μm and a width $W_1$ greater than 50 μm, such as approximately 80 μm. FIG. 3C illustrates the third substrate 330 bonded to the first substrate 310. A portion of the stand-off structure 336 is brought into contact with a portion of the first substrate 310 to form a bond by any suitable bonding process, such as the fusion and eutectic bonding processes discussed above. In the present example, the material layer 334 (for example, germanium) is brought into contact with the material layer 316 (for example, a metal such as aluminum copper), and the contacting portions are bonded by a eutectic bonding process.

Figure 3D:
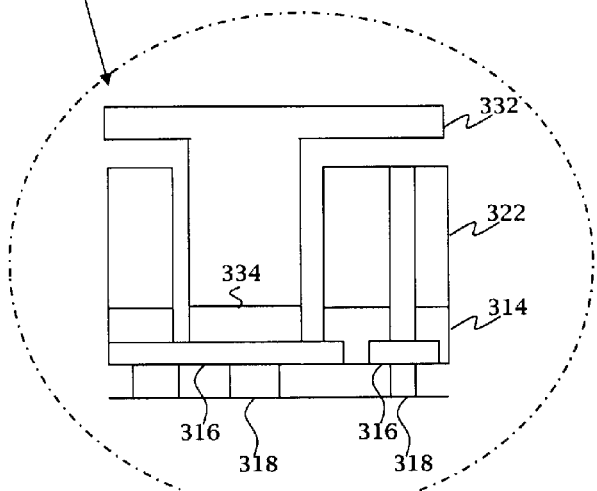

FIG. 3D provides a magnified view of the first and third substrates 310, 330 bonded together, including the stand-off structure 336 and socket 326. As evident, when the third substrate 330 is bonded to the first substrate 310 (i.e., the stand-off structure 336 is in contact with a portion of the socket 326), the dimensions of the stand-off structure 336 and socket 326 are such that space remains between the third substrate 330 and first, second substrates 310, 320. The space within the socket 326 may provide room for spill out of squeezed alloy arising during a bonding process. The stand-off/cavity structure thus can effectively contain spill out.

In summary, a second substrate including MEMS devices may be protected or encased by a first substrate and a third substrate, wherein the second and third substrates are each bonded to the first substrate. Bonding the third substrate directly to the first substrate, instead of the MEMS structure substrate, may protect the MEMS device from damage, improving MEMS device reliability. It is understood that multiple MEMS structures may be disposed between the first and third substrates. In such a case, stacked MEMS structures would be bonded to the first substrate. For example, an integrated circuit device may include a first substrate, a lower MEMS structure, a third substrate, and multiple other MEMS structures. The multiple other MEMS structures may include stand-off structures that extend through the lower MEMS structure to bond with the first substrate, similarly to the third substrate. Other embodiments and examples are contemplated.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a first substrate;
   bonding a second substrate to the first substrate, the second substrate including a microelectromechanical system (MEMS) device; and
   bonding a third substrate to the first substrate, wherein bonding the third substrate to the first substrate comprises extending a portion of the third substrate through the second substrate, wherein an open space separates a sidewall of the portion of the third substrate from the second substrate.

2. The method of claim 1 wherein bonding the second substrate to the first substrate comprises performing a fusion bonding process or a eutectic bonding process.

3. The method of claim 1 wherein bonding the third substrate to the first substrate comprises performing a fusion bonding process or a eutectic bonding process.

4. The method of claim 1 wherein extending the portion of the third substrate through the second substrate comprises:
   forming a socket in the second substrate, wherein a portion of the first substrate is exposed;
   forming a stand-off structure in the third substrate; and
   aligning the stand-off structure with the socket so that the stand-off structure contacts the exposed portion of the first substrate.

5. The method of claim 4 wherein forming the stand-off structure in the third substrate comprises forming a stand-off structure length slightly larger than a socket length and a stand-off structure width slightly smaller than a socket width.

6. The method of claim 4 wherein forming the socket in the substrate comprises patterning the MEMS device and the socket with a same mask.

7. The method of claim 4 wherein forming the stand-off structure in the third substrate comprises utilizing a single mask.

8. A method comprising:
   providing a first, second, and third substrate;
   bonding the second substrate to the first substrate;
   patterning the second substrate to form a MEMS device and a cavity extending through the second substrate to expose a portion of the first substrate;
   patterning the third substrate to form a stand-off portion, wherein patterning the second substrate to form the cavity and patterning the third substrate to form the stand-off portion comprises allowing for a space between a wall of the cavity and a wall of the stand-off portion when the stand-off portion contacts the exposed portion of the first substrate through the cavity; and
   bonding the third substrate to the first substrate by bringing the stand-off portion in contact with the exposed portion of the first substrate through the cavity.

9. The method of claim 8 wherein bonding the second substrate to the first substrate comprises forming a fusion bond and bonding the third substrate to the first substrate comprises forming a eutectic bonding.

10. The method of claim 8 wherein patterning the second substrate comprises patterning the MEMS device and the cavity with a same mask.

11. The method of claim 8 wherein patterning the third substrate to form a stand-off portion comprises utilizing a single mask.

12. The method of claim 9 wherein the fusion bond comprises oxide/silicon bonding or silicon/silicon bonding, and wherein the eutectic bond comprises metal/metal bonding or metal/semiconductor bonding.

13. A method comprising:
   providing a first substrate;
   positioning a second substrate over the first substrate, the second substrate being distinct from the first substrate and including a microelectromechanical system (MEMS) device and a cavity extending through the second substrate; and positioning a stand-off portion of a third substrate through the cavity of the second substrate, wherein a space separates the cavity of the second substrate from the stand-off portion of the third substrate.

14. The method of claim 13 wherein positioning the second substrate over the first substrate includes bonding the second substrate to the first substrate by a fusion bond.

15. The method of claim 14 wherein the fusion bond comprises oxide/silicon bonding or silicon/silicon bonding.

16. The method of claim 13 wherein the stand-off portion of the third substrate is bonded to the first substrate by a eutectic bond.

17. The method of claim 16 wherein the eutectic bond comprises metal/metal bonding or metal/semiconductor bonding.

18. The method of claim 15 wherein the stand-off portion of the third substrate is formed by patterning the third substrate.

19. The method of claim 1, wherein the open space separates the sidewall of the portion of the third substrate from the first substrate.

20. The method of claim 8, wherein forming the stand-off portion comprises forming a stand-off portion length larger than a cavity length and a stand-off portion width smaller than a cavity width.

* * * * *